United States Patent
Pi et al.

(10) Patent No.: US 9,147,833 B2
(45) Date of Patent: Sep. 29, 2015

(54) HYBRIDIZED OXIDE CAPPING LAYER FOR PERPENDICULAR MAGNETIC ANISOTROPY

(71) Applicant: Headway Technologies, Inc., Milpitas, CA (US)

(72) Inventors: Keyu Pi, San Jose, CA (US); Yu-Jen Wang, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 24 days.

(21) Appl. No.: 13/935,826

(22) Filed: Jul. 5, 2013

(65) Prior Publication Data

US 2015/0008547 A1    Jan. 8, 2015

(51) Int. Cl.
| | | |
|---|---|---|
| *H01L 29/82* | (2006.01) | |
| *H01L 43/04* | (2006.01) | |
| *H01L 27/22* | (2006.01) | |
| *H01L 43/14* | (2006.01) | |
| *G11C 11/16* | (2006.01) | |
| *H01L 43/08* | (2006.01) | |
| *H01L 43/10* | (2006.01) | |
| *H01L 43/12* | (2006.01) | |

(52) U.S. Cl.
CPC .............. *H01L 43/04* (2013.01); *G11C 11/161* (2013.01); *H01L 27/222* (2013.01); *H01L 43/08* (2013.01); *H01L 43/10* (2013.01); *H01L 43/12* (2013.01); *H01L 43/14* (2013.01)

(58) Field of Classification Search
CPC ..... H01L 43/08; H01L 29/82; H01L 23/5226; H01L 23/528; H01L 27/222; H01L 43/065; G11C 11/16

USPC ........ 257/20, 414, 421–427, E29.323; 438/3; 365/324–326, 313; 360/157–158
See application file for complete search history.

(56) References Cited

U.S. PATENT DOCUMENTS

| | | |
|---|---|---|
| 2007/0253122 A1 | 11/2007 | Fukuzawa et al. |
| 2012/0018823 A1* | 1/2012 | Huai et al. ........... 257/421 |
| 2012/0155156 A1 | 6/2012 | Watts et al. |
| 2012/0205758 A1 | 8/2012 | Jan et al. |
| 2012/0236631 A1 | 9/2012 | Park et al. |

(Continued)

OTHER PUBLICATIONS

"Current-driven excitation of magnetic multilayers," by J.C. Slonczewski, Journal of Magnetism and Magnetic Materials 159, L-1-L-7, Elsevier, Jun. 1996.

(Continued)

*Primary Examiner* — Jami M Valentine
(74) *Attorney, Agent, or Firm* — Saile Ackerman LLC; Stephen B. Ackerman

(57) ABSTRACT

A hybrid oxide capping layer (HOCL) is disclosed and used in a magnetic tunnel junction to enhance thermal stability and perpendicular magnetic anisotropy in an adjoining free layer. The HOCL has a lower interface oxide layer and one or more transition metal oxide layers wherein each of the metal layers selected to form a transition metal oxide has an absolute value of free energy of oxide formation less than that of the metal used to make the interface oxide layer. One or more of the HOCL layers is under oxidized. Oxygen from one or more transition metal oxide layers preferably migrates into the interface oxide layer during an anneal to further oxidize the interface oxide. As a result, a less strenuous oxidation step is required to initially oxidize the lower HOCL layer and minimizes oxidative damage to the free layer.

24 Claims, 5 Drawing Sheets

(56) References Cited

U.S. PATENT DOCUMENTS

2012/0300542 A1 11/2012 Uchida et al.
2013/0075839 A1* 3/2013 Chen et al. .................. 257/421

OTHER PUBLICATIONS

"Some Thermodynamic Relations Among the Vanadium Oxides, and Their Relation to the Oxidation State of the Uranium Ores of the Colorado Pleateaus," by Robert M. Garrels, 1953, Am. Mineralogist, v. 38, p. 1251-1265.

"Perpendicular-anisotropy CoFeB—MgO magnetic tunnel junctions with a MfO/CoFeB/Ta/CoFeB/MgO recording structure," H. Sato et al., Applied Physics Letters, 101, 022414, Jul. 2012, American Institute of Physics.

"A perpendicular-anisotropy CoFeB—MgO magnetic tunnel junction," by S. Ikeda et al., nature materials, vol. 9, Sep. 2010, pp. 721-724, DOI: 10.1038/NMAT2804.

"Enhancement of perpendicular magnetic anistropy in FeB free layers using a thin MgO cap layer," by Hitoshi Kuboto et al., pp. 1-3, Journal of Applied Physics 111, 07C723, Mar. 2012.

PCT Search Report PCT/US2014/042251 Mailed: Oct. 13, 2014, Headway Technologies Inc.

* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | −7 |
| Ru | $RuO_2$ | −253 |
| Cu | CuO | −254 |
| Co | CoO | −426 |
| Ni | NiO | −432 |
| Fe | FeO | −488 |
| Fe | $Fe_2O_3$ | −495 |
| Mo | $MoO_2$ | −502 |
| W | $WO_3$ | −509 |
| Sn | SnO | −514 |
| Zn | ZnO | −636 |
| Cr | $Cr_2O_3$ | −699 |
| Nb | $Nb_2O_5$ | −708 |
| Ta | $Ta_2O_5$ | −788 |
| B | $B_2O_3$ | −796 |
| Si | $SiO_2$ | −805 |
| Mn | $Mn_2O_3$ | −854 |
| Ti | $TiO_2$ | −890 |
| Zr | $ZrO_2$ | −1037 |
| Al | $Al_2O_3$ | −1053 |
| Ba | BaO | −1056 |
| Hf | $HfO_2$ | −1084 |
| Mg | MgO | −1146 |
| Ca | CaO | −1208 |

*FIG. 9*

HYBRIDIZED OXIDE CAPPING LAYER FOR PERPENDICULAR MAGNETIC ANISOTROPY

RELATED PATENT APPLICATION

This application is related to the following: Ser. No. 12/931,866, filing date Feb. 11, 2011; which is assigned to a common assignee and is herein incorporated by reference in its entirety.

TECHNICAL FIELD

The present disclosure relates to a magnetic tunnel junction (MTJ) in which a hybrid oxide capping layer is used to enhance perpendicular magnetic anisotropy (PMA) in an adjoining free layer to increase free layer coercivity and thermal stability while maintaining other properties including magnetoresistance (MR) ratio and resistance×area (RA) value.

BACKGROUND

Perpendicular magnetic anisotropy (PMA) is widely used in devices requiring out-of-plane magnetization including Spin Torque Magnetic Random Access Memory (STT-MRAM) that has been described by C. Slonczewski in "Current driven excitation of magnetic multilayers", J. Magn. Magn. Mater. V 159, L1-L7 (1996). In STT-MRAM, a magnetic layer with PMA can serve as a free layer, pinned layer, reference layer, or dipole compensation layer. PMA layers are found in various designs of PMA spin valves, magnetic tunnel junctions (MTJs), in PMA media in magnetic sensors and magnetic data storage, and within other spintronic devices.

Compared with conventional MRAM, STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic layer and non-magnetic spacer. Through this interaction, the electrons transfer a portion of their angular momentum to the ferromagnetic free layer. As a result, spin-polarized current can switch the magnetization direction of the ferromagnetic free layer if the current density is sufficiently high, and if the dimensions of the multilayer are small.

For STT-MRAM to be viable in the 90 nm technology node and beyond, the ultra-small MTJs (also referred to as nanomagnets) must exhibit a MR ratio that is much higher than in a conventional MRAM-MTJ which uses a NiFe free layer and AlOx as the tunnel barrier layer. The critical current density (Jc) must be lower than about $10^6$ A/cm$^2$ to be driven by a CMOS transistor that can typically deliver 100 µA per 100 nm gate width. Furthermore, a ferromagnetic layer with a long retention time is important for device application. To achieve this property that requires a high thermal stability, a free layer made of PMA material is preferred in order to provide a high energy barrier (Eb) and high coercivity. Strong PMA character is induced along an interface of a CoFeB layer or the like and a metal oxide such as MgO, for example. A ferromagnetic free layer must be thin enough so that induced PMA overcomes in-plane anisotropy. Intrinsic PMA is realized in laminated stacks including (Co/Pt)$_n$, (Co/Pd)$_n$, and (Co/Ni)$_n$ where n is the number of laminations but the MTJ may suffer from a lower magnetoresistive (MR) ratio than when CoFe or CoFeB is used for the free layer and/or reference layer.

When a memory element uses a free layer with a magnetic moment lying in the plane of the film, the current needed to change the magnetic orientation of a magnetic region is proportional to the net polarization of the current, the volume, magnetization, Gilbert damping constant, and anisotropy field of the magnetic region to be affected. The critical current ($i_C$) required to perform such a change in magnetization is given in equation (1):

$$i_c = \frac{\alpha e V M s}{g\hbar}\left[H_{k_{eff},\parallel} + \frac{1}{2}H_{k_{eff},\perp}\right] \quad (1)$$

where $e$ is the electron charge, $\alpha$ is a Gilbert damping constant, Ms is the saturation magnetization of the free layer, $\hbar$ is the reduced Plank's constant, g is the gyromagnetic ratio, $H_{k_{eff},\parallel}$ is the in-plane anisotropy field, and $H_{k_{eff},\perp}$ is the out-of-plane anisotropy field of the magnetic region to switch, and V is the volume of the free layer. For most applications, spin polarized current must be as small as possible.

The value $\Delta = kV/k_BT$ is a measure of the thermal stability of the magnetic element. If the magnetization lies in-plane, the value can be expressed as shown in equation (2):

$$\Delta = \frac{M_S V H_{k_{eff},\parallel}}{2k_B T} \quad (2)$$

where $k_B$ is the Boltzmann constant and T is the temperature.

Unfortunately, to attain thermal stability of the magnetic region, a large net magnetization is required which in most cases would increase the spin polarized current necessary to change the orientation of the magnetic region.

When the free layer has a magnetization direction perpendicular to the plane of the film, the critical current needed to switch the magnetic element is directly proportional to the perpendicular anisotropy field as indicated in equation (3):

$$i_c = \frac{\alpha e M s V H_{k_{eff},\perp}}{g\hbar} \quad (3)$$

The parameters in equation (3) were previously explained with regard to equation (1).

Thermal stability is a function of the perpendicular anisotropy field as shown in equation (4):

$$\Delta = \frac{M_S V H_{k_{eff},\parallel}}{2k_B T} \quad (4)$$

In both of the in-plane and out-of-plane configurations, the perpendicular anisotropy field of the magnetic element is expressed in equation (5) as:

$$H_{k_{eff},\perp} = -4\pi M_s + \frac{2K_U^{+,s}}{M_s d} + K_{k,X,\perp} \quad (5)$$

where $M_s$ is the saturation magnetization, d is the thickness of the magnetic element, $H_{k,\chi,\perp}$ is the crystalline anisotropy field in the perpendicular direction, and $K_U^{\perp,s}$ is the surface perpendicular anisotropy of the top and bottom surfaces of the magnetic element. In the absence of strong crystalline anisotropy, the perpendicular anisotropy field of a magnetic layer is dominated by the shape anisotropy field ($-4 \pi M_s$) on which little control is available. However, by enhancing the surface (interfacial) perpendicular anisotropy component, the perpendicular anisotropy (PMA) field is increased. Although MTJ structures with reference layer/tunnel barrier/free layer configuration such as CoFeB/MgO/CoFeB deliver a high MR ratio, there is still a need to enhance the PMA field component in a MTJ for higher thermal stability while maintaining a high MR ratio.

SUMMARY

One objective of the present disclosure is to provide a composite capping layer that enhances PMA in an adjoining free layer within a MTJ element thereby improving thermal stability without degrading MR ratio or other magnetic properties in the magnetic device.

A second objective of the present disclosure is to provide a method of forming the composite capping layer according to the first objective that avoids the diffusion of oxygen into the free layer.

According to one embodiment, these objectives are achieved with a magnetic tunnel junction (MTJ) comprised of a reference layer, tunnel barrier layer, free layer, and a hybrid oxide capping layer that includes at least an interface oxide layer contacting the free layer at a first interface, and an upper oxide layer that has an absolute value of free energy of oxide formation less than that of the interface oxide layer. In an alternative embodiment, the upper oxide layer may be a laminate of oxides each having an absolute value of free energy of oxide formation less than that of the interface oxide layer. In other words, the metal oxide selected for the upper oxide layer should not attract oxygen from the interface oxide layer during an anneal step which would undesirably decrease the induced perpendicular anisotropy at the free layer/HOCL interface. The one or more metals selected to form the upper oxide layer should be more difficult to oxidize than the metal or alloy chosen for the interface oxide layer. Preferably, the interface oxide layer is in an under oxidized state following an initial oxidation step and becomes further oxidized by attracting oxygen from the upper oxide layer during a subsequent anneal step. As a result, the initial oxidation step is accomplished with weak oxidation conditions such as low oxygen pressure and/or short oxidation time that reduce the risk of oxidative damage to the free layer.

The upper oxide layer may be oxidized with less than a stoichiometric amount of oxygen to give an underoxidized state in order to promote good conductivity. High conductivity may also be realized in the HOCL through doping of one or more oxide layers with a metal component, or employing a phase transition composition such as α-Ta in a TaOx layer rather than β-Ta. In one aspect, the interface oxide layer induces or enhances PMA in the free layer, and the HOCL preferably has a thickness from 3 to 15 Angstroms to minimize the RA contribution to the MTJ. Moreover, the tunnel barrier layer is preferably an oxide of a metal or alloy and induces or enhances PMA in the free layer along a second interface.

The free layer may be a single layer or a composite that is an alloy of Fe with one or more of Co, Ni, and B and with a thickness between 5 and 20 Angstroms. Preferably, the free layer is thin enough so that the perpendicular surface anisotropy field at the two oxide interfaces dominates the shape anisotropy field in the plane of the free layer. The MTJ may have a bottom spin valve structure represented by seed layer/reference layer/tunnel barrier/free layer/HOCL or by seed layer/HOCL/reference layer/tunnel barrier/free layer/capping layer. In another embodiment with a top spin valve scheme, the MTJ stack has a seed layer/HOCL/free layer/tunnel barrier/reference layer/capping layer configuration.

In yet another embodiment, the free layer (FL) and HOCL may form a laminate (FL/HOCL)$_m$ where m≥2 and is the number of laminations. The sum of the thicknesses from the plurality of HOCL layers must be controlled to maintain an acceptable RA value for the MTJ stack.

According to a preferred method of forming a HOCL, a first metal or alloy layer is deposited on the free layer and is partially oxidized to form an interface oxide such as MgO, MgTaOx, SrTiOx, BaTiOx, CaTiOx, LaAlOx, MnOx, or VOx. Then, a second metal layer or metal laminate is deposited on the interface oxide layer. Subsequently, a second oxidation process is performed to at least partially oxidize the second metal layer or multiple metal layers in a metal laminate to form one or more transition metal oxides including RuOx, PtOx, RhOx, MoOx, WOx, SnOx, or InSnOx. During an anneal step, oxygen from the transition metal oxide layer migrates downward to further oxidize the interface oxide layer. In an alternative embodiment, the second metal is deposited on an unoxidized first metal or alloy layer. The second metal layer is at least partially oxidized. During a subsequent anneal process, oxygen from the upper oxide layer diffuses downward to at least partially oxidize the first metal or alloy layer. As a result, oxygen diffusion into the free layer is effectively avoided during metal oxidation steps and during a post-anneal process to yield a high MR ratio and enhanced PMA.

BRIEF DESCRIPTION OF THE DRAWINGS

FIG. 9 is a table that lists the free energy of oxide formation for different elements.

DETAILED DESCRIPTION

The present disclosure is a magnetic element wherein a hybrid oxide capping layer is used to enhance PMA in an adjoining free layer or another ferromagnetic layer thereby improving thermal stability of the magnetic element. Although the exemplary embodiments depict a bottom spin valve or top spin valve configuration, a dual spin valve design is also within the scope of this disclosure as appreciated by those skilled in the art. The magnetic element may be employed as a MTJ in a STT-MRAM or in other spintronic devices, or as a propagation medium for a domain wall in a domain wall motion device. The terms interfacial perpendicular anisotropy and surface perpendicular anisotropy may be used interchangeably. Absolute value of free energy of oxide formation as used herein is a non-negative value. Since most free energy of oxide formation values are negative, elements near the top of the table in FIG. 9 have smaller absolute values of free energy of oxide formation than elements near the bottom of the table.

Figure 1:
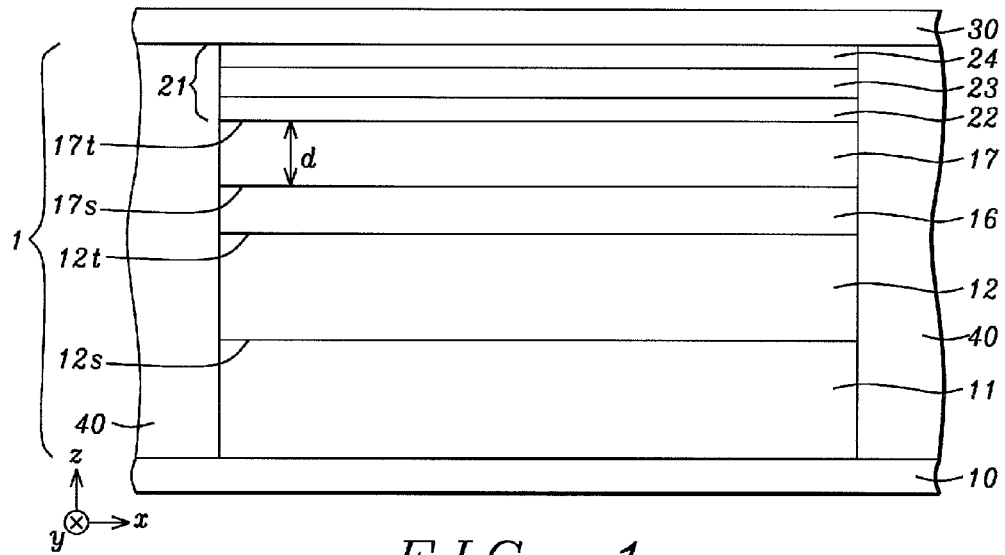
FIG. 1 is a cross-sectional view showing a magnetic tunnel junction (MTJ) with a hybrid oxide capping layer (HOCL) and a bottom spin valve configuration according to one embodiment of the present disclosure.

Referring to FIG. 1, the most general embodiment of the present disclosure is illustrated wherein a MTJ 1 is comprised of a buffer layer 11, a reference layer 12, tunnel barrier 16, free layer 17, and a hybrid oxide capping layer (HOCL) 21 that are sequentially formed on a substrate 10. A top electrode 30 also known as a bit line may be formed on a top surface of the HOCL. The substrate may be a bottom electrode in a STT-MRAM, for example. The buffer layer preferably includes one or more seed layers for enhancing uniform crystal growth in overlying layers, and may enhance or induce PMA in the overlying reference layer along a first interface 12b. The buffer layer may be comprised of NiCr, TiN, NiFe, NiFeCr, Mg/Ta, or other suitable seed layer materials.

Preferably, both of the reference layer and free layer exhibit PMA for optimum thermal stability in the MTJ element. In one aspect, the reference layer is made of one or more ferromagnetic layers (RL) including CoFe, CoFeB, Co, CoFeB/Co, and the like. Although a reference layer with a RL composition typically exhibits in-plane anisotropy, a thin reference layer from about 5 to 20 Angstroms thick with one of the aforementioned compositions may have PMA that is induced along top and bottom interfaces 12b, 12t, respectively, wherein the PMA field in reference layer 12 overcomes in-plane anisotropy. In an alternative embodiment, the reference layer has intrinsic PMA derived from a $(A1/A2)_n$ laminated structure where A1 is a first metal or alloy selected from one or more of Co, Ni, and Fe, A2 is a second metal or alloy selected from one or more of Co, Fe, Ni, Pt, and Pd, n is the number of laminates in the $(A1/A2)_n$ stack, and A1 is unequal to A2. Thus, the reference layer 12 may be one of $(Co/Pt)_n$, $(Co/Pd)_n$, $(Fe/Pt)_n$, $(Fe/Pd)_n$, $(Co/Ni)_n$, $(CoFe/Ni)_n$, $Co/NiFe)_n$, $(Co/NiCo)_n$, $(CoFe/NiFe)_n$, or $(CoFe/NiCo)_n$, for example. The present disclosure also anticipates that the reference layer may be a composite such as $(A1/A2)_n$/CoFeB/Co with a lower $(A1/A2)_n$ laminated structure on the buffer layer, and an upper RL layer that contacts the tunnel barrier layer 16. Furthermore, there may be a non-magnetic spacer such as Ta formed between the $(A1/A2)_n$ laminate and the upper layer to give a $(A1/A2)_n$/Ta/RL configuration.

Reference layer 12 contacts the tunnel barrier layer 16 along a second interface 12t. Preferably, the tunnel barrier layer is a metal oxide including but not limited to MgO, $Al_2O_3$, TiOx, ZnOx, and HfOx or laminates thereof formed between the reference layer and an overlying free layer 17. As a result, the tunnel barrier layer induces a spin dependent tunneling effect between the reference layer and free layer, induces PMA in a portion of the reference layer proximate to the second interface, and induces PMA in a portion of the free layer along a third interface 17b. When the free layer has a magnetic moment aligned in a z-axis direction that is parallel to the magnetic moment of the reference layer, a "0" memory state is realized. When the magnetic moments of the free layer and reference layer are aligned anti-parallel to one another along the z-axis, then a "1" memory state exists.

According to one embodiment, a MgO tunnel barrier 16 is formed by a natural oxidation (NOX) process whereby a first Mg layer is sputter deposited on the reference layer and is subsequently oxidized by a NOX method. Typically, the NOX process comprises an oxygen flow in an oxidation chamber within a sputter deposition main frame system. A subsequent annealing step after the remaining MTJ layers are laid down essentially forms a uniform MgO tunnel barrier layer wherein the second Mg layer in the tunnel barrier stack is oxidized by oxygen diffusion from the underlying MgO layer and by gettering oxygen from the free layer 17. Optionally, the Mg deposition and NOX oxidation sequence may be repeated one or more times before the uppermost Mg layer is deposited on the tunnel barrier stack and subsequently oxidized during an anneal step.

According to one embodiment, the free layer (FL) is a ferromagnetic layer comprised of one or more of CoFeB, CoFe, Co, Fe, CoB, FeB, and CoFeNiB, and preferably has a thickness between 5 and 20 Angstroms so that PMA induced along an interface 17b with the tunnel barrier and PMA induced along an interface 17t with an interface oxide layer 22 exceeds the shape anisotropy field in the free layer to generate out-of-plane anisotropy in FL. When the free layer has a $Co_wFe_yB_z$ composition, preferably y is greater than w, and z is <35 atomic %.

Figure 2:
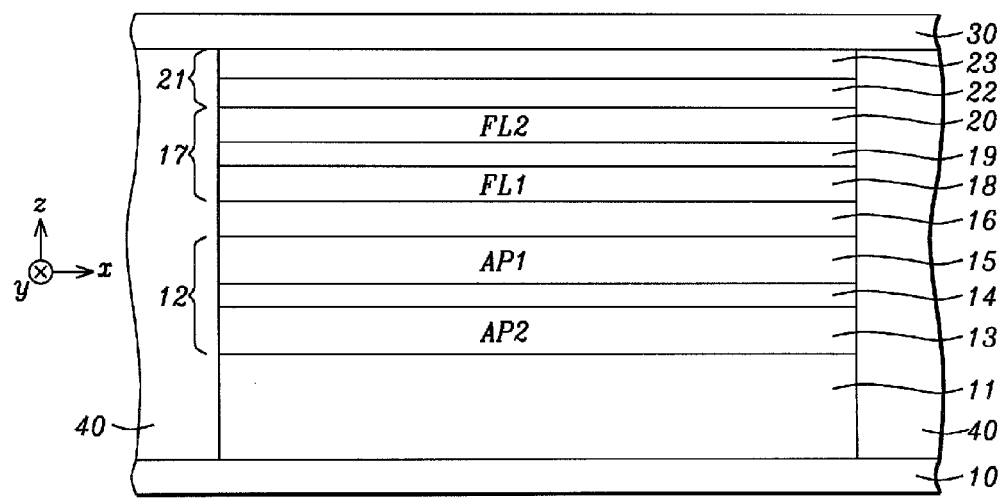
FIG. 2 is a cross-sectional view of a MTJ with a HOCL according to a second embodiment of the present disclosure wherein the MTJ has a SAF reference layer and a non-magnetic insertion layer in the free layer (FL).

In an alternative embodiment wherein the free layer is made of CoFeB, a non-magnetic spacer (S) such as Ta, Mg, Zr, Hf, Mo, W, or Nb may be included to give a CoFeB/S/CoFeB or FL1/S/FL2 configuration where bottom and top ferromagnetic layers in the free layer are designated as FL1 and FL2, respectively, as illustrated in FIG. 2. In this case, the non-magnetic spacer has a thickness from 0.5 to 10 Angstroms, and preferably 1 to 5 Angstroms. The non-magnetic spacer serves as a moment diluting layer to decrease magnetization in the free layer and thereby reduces the demagnetizing field of the magnetic element. The thickness of each of the FL1 and FL2 layers is preferably from 7 to 15 Angstroms. Thus, the combined thickness of the FL1 and FL2 layers may be greater than that of a single FL layer described above in order to increase free layer volume and thereby compensate for a loss of Ms in equation (2) presented previously. As a result, thermal stability in a composite free layer with a FL1/S/FL2 configuration is not adversely affected compared with a free layer FL.

Returning to FIG. 1, the free layer 17 may be a composite with a lower FL portion adjoining the tunnel barrier layer 16, and an upper $(A1/A2)_n$ stack as described previously with respect to reference layer composition to give a FL/$(A1/A2)_n$ configuration. Moreover, a non-magnetic spacer such as Ta may be inserted in the aforementioned composite to provide a FL/Ta/$(A1/A2)_n$ free layer configuration.

In the aforementioned free layer configurations, there is strong perpendicular surface anisotropy ($K_{U1}^{\perp,S}$ in equation 5) at interface 17b. Similarly, interface oxide layer 22 is responsible for strong perpendicular surface anisotropy ($K_{U2}^{\perp,S}$) along interface 17t. The total thickness d of the free layer 17 is thin enough so that the interfacial perpendicular anisotropy $(K_{U1}^{1,S}+K_{U2}^{1,S})/M_s d$ is significant compared with the shape anisotropy field. For example, the shape anisotropy field 4 πMs for a $Co_{20}Fe_{60}B_{20}$ free layer is approximately 12000 Oe. We have found interfacial perpendicular anisotropy may be greater than 12000 Oe by maintaining thickness d in a range of 5 to 25 Angstroms, and preferably 5 to 20 Angstroms. Under such conditions, an out-of-plane magnetization is established in the free layer.

A key feature of the present disclosure is a hybrid oxide capping layer (HOCL) 21 formed on the free layer 17. The HOCL has at least a bottom interface oxide layer 22 and a transition metal oxide 23 contacting a top surface of the interface oxide. In the exemplary embodiment, a second transition metal oxide layer 24 is formed as the uppermost layer in the HOCL wherein each transition metal or alloy included in oxide layers 23, 24 has an absolute value of free energy of oxide formation less than that of the metal in the interface oxide layer. FIG. 9 lists a table of free energy of oxide formation values for various elements. Preferably, each of the first and second transition metals has a higher position in the table and is more difficult to oxidize than the metal selected for the interface oxide layer. In other words, each of the first and second transition metal oxides has free energy of oxide formation that is a smaller negative number and smaller in absolute value than the interface oxide. The present disclosure encompasses a HOCL scheme wherein a plurality of transition metal oxide layers may be formed on the interface oxide as a laminated stack. Moreover, each of the plurality of metals selected for the transition metal oxide layers in the laminated stack has an absolute value of free energy of oxide formation less than that of the metal chosen for the interface oxide layer.

HOCL 21 contributes a RA value such that the overall RA for the MTJ is a combination of RA from the tunnel barrier ($RA_{TB}$) and RA from the HOCL ($RA_{HOCL}$) where total RA= ($RA_{TB}$)+($RA_{HOCL}$). RA value is dependent on the thickness of an oxide layer whether it is the tunnel barrier layer 16 or the HOCL. For example, reducing the thickness of one or both of tunnel barrier layer and HOCL decreases the total RA value. Furthermore, total RA value may lowered by reducing the oxidation state in one or more oxide layers within the tunnel barrier layer and HOCL. When a NOX or ROX process is employed, a lower oxidation state (under oxidized state) may be achieved in the tunnel barrier and HOCL by using a shorter oxidation time or a lower $O_2$ flow rate to oxidize one or more metal layers.

According to one embodiment, the interface oxide layer 22 is one or more of MgTaOx, SrTiOx, BaTiOx, CaTiOx, LaAlOx, MgO, TaOx, MnOx, VOx, and BOx. Preferably, the interface oxide is MgTaOx or the like that has a RA value less than that of an equivalent thickness of MgO. The transition metal oxide layers 23, 24 are preferably comprised of one or more of RuOx, PtOx, RhOx, MoOx, WOx, SnOx, or InSnOx wherein the transition metal or alloy used to form the first transition metal oxide (TM1Ox) 23 is different from the transition metal or alloy selected to form the second transition metal oxide (TM2Ox) layer 24. Thus, the HOCL stack may have a MgO/TaOx/TM1Ox/TM2Ox or MgTaOx/TM1Ox/TM2Ox configuration, for example, depending on whether Mg and Ta are deposited as individual metal layers or as an alloy. As mentioned earlier, the present disclosure anticipates that transition metal oxide layer 24 may be omitted to give a HOCL bilayer design comprising oxide layers 22, 23.

One or more of the oxide layers 22-24 in the HOCL may be in an underoxidized state meaning less than a stoichiometric amount of oxygen is used to partially oxidize a metal or alloy layer. As a result, one or more oxide layers 22-24 in the HOCL may be comprised of a certain number of unoxidized metal (or alloy) atoms. However, as the oxygen content in the interface oxide layer decreases, the strength of the induced PMA field in the adjoining free layer is also reduced. Thus, a compromise must be reached between a sufficiently high oxidation state in the interface oxide layer to generate or enhance PMA in the free layer 17 while avoiding a saturated or "over" oxidized state where unreacted oxygen is able to diffuse into the free layer from the interface oxide layer 22 and cause oxidative damage to degrade magnetic performance including PMA and MR ratio.

According to one preferred process of fabricating the HOCL, a first metal or alloy is sputter deposited on a top surface of the free layer 17. Thereafter, a first oxidation step such as a natural oxidation (NOX) or radical oxidation (ROX) process is performed to achieve at least partial oxidation in the resulting interface oxide layer 22. An over oxidized state should be avoided and can be detected in an experiment where first metal films with a constant thickness are oxidized for various lengths of time under a NOX process, for example. Resistivity measurements are able to indicate a time t1 when an over oxidized state is reached. All oxidation times less than t1 are said to generate an "under" oxidized or partial oxidation state for the interface oxide which is desired for the preferred embodiment. Next, a second metal layer referred to as a first transition metal layer, or a stack of two different transition metal layers is deposited on the interface oxide layer followed by a second oxidation step. The second oxidation step is relied on to at least partially oxidize the second metal layer or the stack of two transition metal layers and thereby form transition metal oxide layer 23, or transition metal layers 23, 24, respectively. In an alternative embodiment, a first transition metal layer is formed on the interface oxide layer and is oxidized with a second oxidation step to form transition metal oxide layer 23. Thereafter, a second transition metal layer is deposited on oxide layer 23 and is oxidized with a third oxidation step to form transition metal oxide layer 24.

A key concept of the present disclosure is to utilize oxygen from one or more of the transition metal oxide layers formed during the second oxidation step, and possibly a third oxidation step, to increase the oxidation state of the under oxidized interface oxide layer formed during the first oxidation step. In other words, the HOCL structure defined herein takes advantage of oxygen gettering by the interface oxide from the one or more transition metal oxide layers during the second oxidation step and/or during a subsequent anneal process. In effect, oxygen from at least a second transition metal oxide layer is purposely leaked into the interface oxide thereby increasing the oxidation state of the interface oxide layer and requiring a less strenuous first oxidation step of the first metal or alloy. As a result, weak oxidation conditions (low oxygen pressure or flow rate, and/or short oxidation time) during the first oxidation step will cause less oxidative damage in the adjoining free layer than in prior art processes which involve oxidation of a capping layer. Furthermore, the enhanced oxidation state in the interface oxide layer as a result of the second oxidation step and anneal will promote higher PMA in the adjoining free layer.

As indicated above, higher conductivity (lower RA values) may be achieved by reducing the oxidation state in one or more of the HOCL layers 22-24. In an alternative embodiment, a transition metal oxide with relatively high conductivity is chosen to optimize performance in STT-MRAM and other spintronic devices that benefit from low resistance. A lower resistance in one or both of the aforementioned transition metal oxide layers 23, 24 may be realized by doping with one or more of Fe, Co, Ni, Ru, Cr, Au, Ag, and Cu.

In another embodiment, RA values in one or more of the HOCL layers may be minimized and conductivity improved by selection of a different phase transition. For example, in interface layer 22, lower resistivity is achieved by oxidation of an α-Ta layer rather than oxidizing a β-Ta layer in a Mg/Ta stack. The resulting interface oxide layer is a MgO/TaOx composite. In another embodiment, α-Ta is co-sputtered with Mg to give a MgTa alloy layer with a Mg:Ta ratio of about 1:1 to 2:1 and the alloy is then oxidized to yield a MgTaOx interface layer.

All layers in MTJ 1 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. Once all of the layers in the MTJ are laid down on a substrate, a high temperature anneal may be performed in an oven by applying a temperature of about 250° C. to 500° C., and preferably near 400° C. for a period of 10 minutes to 2 hours. Thereafter, an array of MTJ elements with substantially vertical sidewalls may be fabricated by a process involving a conventional photolithography patterning and reactive ion etch (RIE) sequence that is well known in the art and will not be described herein. Subsequently, an insulation layer 40 may be deposited to electrically isolate adjacent MTJ elements. Only one MTJ element is shown to simplify the drawing. A chemical mechanical polish (CMP) process is typically employed to form a smooth top surface of the insulation layer which becomes coplanar with a top surface of the MTJ array. Then an additional metal level that includes a bit line 30 may be formed on the MTJ elements to continue the fabrication of a magnetic device.

Referring to FIG. 2, a second embodiment is shown in which the MTJ has a bottom spin valve configuration and the reference layer 12 has a synthetic antiferromagnetic (SAF) structure with an AP2/coupling/AP1 configuration to improve thermal stability of the MTJ and also reduce the interlayer coupling Hin (offset) field applied to the free layer 17. Each of the AP2 layer 13 and AP1 layer 15 may be comprised of one or more of CoFe, CoFeB, and Co and has a thickness from about 5 to 20 Angstroms. The coupling layer 14 is typically made of Ru, Ir, or Rh. The thickness of the AP2 layer and AP1 layer may be modified to adjust the Ho (offset field) to approximately 0 Oe. In another embodiment, one or both of the AP1 and AP2 layers may have an $(A1/A2)_n$ configuration with intrinsic PMA.

Free layer 17 may have a FL composition as described in the first embodiment. However, an alternative free layer structure having a FL1/spacer/FL2 configuration may be advantageously used. Each of the FL1 layer 18 and FL2 layer 20 may be comprised of one or more of CoFe, CoFeB, CoFeNiB, CoB, Co, Fe, or FeB. A non-magnetic spacer 19 made of Ta, Mg, Zr, Hf, Mo, W, Nb, or the like and preferably having a thickness between 1 and 5 Angstroms is formed between the FL1 an FL2 layers and serves as a moment diluting layer. Above the free layer is a HOCL 21 that has a bilayer configuration with a lower interface oxide layer 22 and an upper transition metal oxide layer 23 as described previously. However, a second transition metal oxide layer 24 may be inserted as the uppermost layer in the HOCL as described in the first embodiment.

Figure 3:
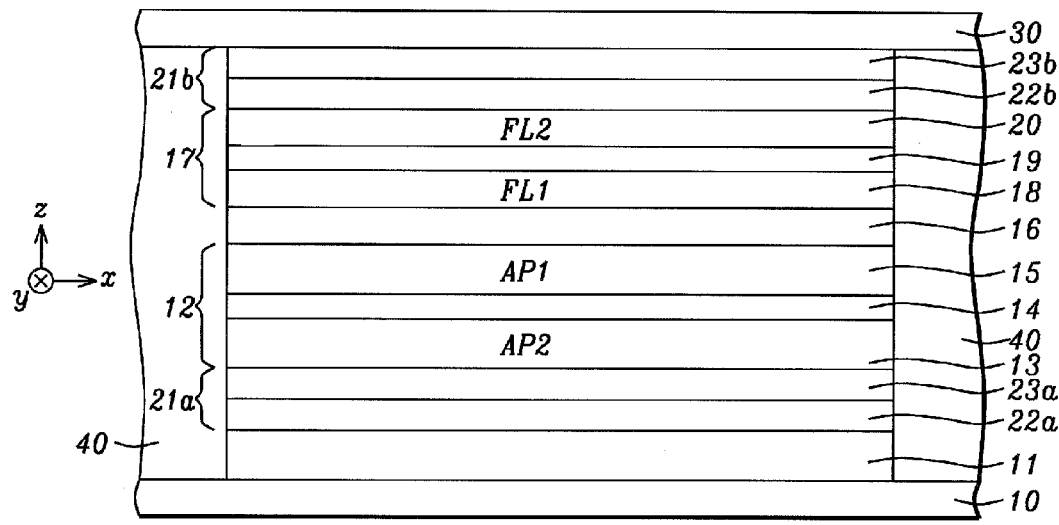
FIG. 3 is a cross-sectional view of a MTJ that features a laminated stack with a (FL/HOCL)$_m$ configuration where m is at least 2.

Referring to FIG. 3, the present disclosure also encompasses an embodiment wherein a HOCL is employed to enhance PMA in an adjoining reference layer within a MTJ that has a seed layer/HOCL/reference layer/tunnel barrier/free layer/HOCL configuration. As in previous embodiments, a seed layer 11 is preferably formed on substrate 10. In one aspect, a first HOCL 21a is formed on the seed layer and comprises a lower transition metal oxide layer 23a and an upper interface oxide layer 22a. Reference layer 12 may be a single layer or composite RL as described previously or may have a SAF configuration as depicted in the exemplary embodiment. Likewise, free layer 17 may be a FL as described earlier in the first embodiment or may be a composite with a FL1/spacer/FL2 configuration. There may be a second HOCL 21b formed on the free layer with a lower interface oxide layer 22b and an upper transition metal oxide layer 23b. The composition and attributes of the interface oxide layers 22a, 22b are equivalent to that of interface oxide layer 22 in previous embodiments. Moreover, transition metal oxide layers 23a, 23b may have the same composition as that of transition metal oxide layer 23 described previously. The present disclosure also anticipates an embodiment wherein a second transition metal oxide layer is included in one or both of the HOCL 21a and HOCL 21b. In HOCL 21a, a second transition metal oxide layer (not shown) may be inserted between seed layer 11 and transition metal oxide layer 23a. HOCL 21b may have a trilayer structure equivalent to HOCL 21 in FIG. 1.

Figure 4:
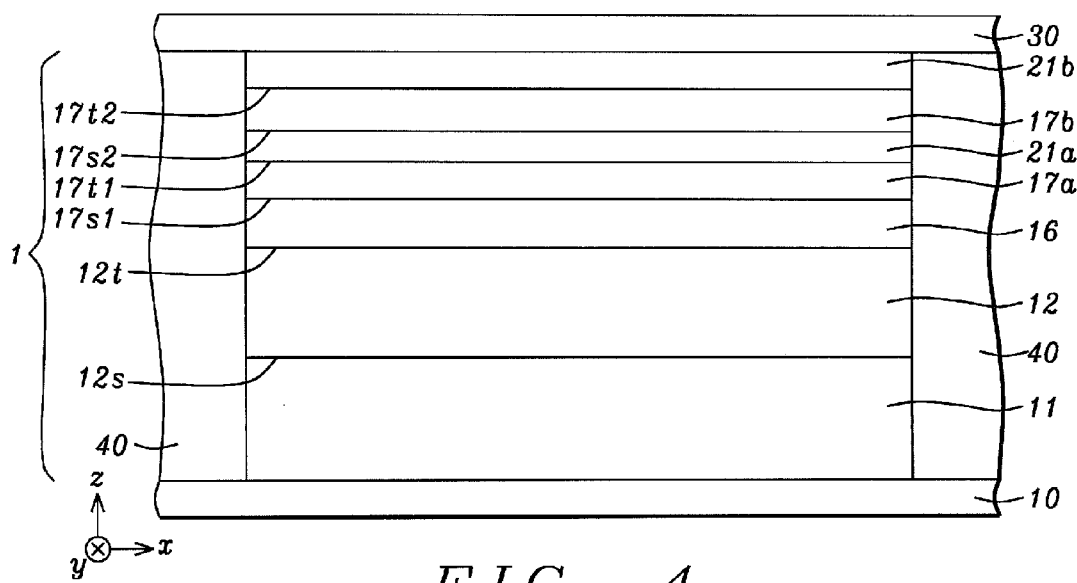
FIG. 4 is a cross-sectional view of a bottom spin valve structure where a HOCL is formed between a seed layer and a reference layer.

In FIG. 4, a fourth embodiment is depicted in which a laminated $(FL/HOCL)_m$ stack where m≥2 is formed on a tunnel barrier layer in a bottom spin valve configuration. Thus, all of the layers are retained from the first embodiment except the FL/HOCL structure is repeated one or more times to form a plurality of FL and HOCL layers. In the exemplary drawing, m=2 and the reference layer forms an interface 12s with seed layer 11 and another interface 12t with tunnel barrier layer 16. PMA is enhanced in free layer 17a through a first interface 17s1 with the tunnel barrier and a second interface 17t1 with a first HOCL 21b. Note that individual layers within HOCL 21b (and HOCL 21c) are not shown but it is understood that each of the HOCL are comprised of two or more oxide layers including a lower interface layer and at least one transition metal oxide layer as the upper layer in each FL/HOCL stack. A second free layer 17b is formed on the first HOCL and is ferromagnetically coupled to the first free layer. PMA in free layer 17b is induced or enhanced through an interface 17s2 with the first HOCL and by interface 17t2 with an overlying second HOCL 21c. It should be understood that the reference layer may have a RL structure as described in the first embodiment or a SAF structure found in the second embodiment. One or both of the interface oxide layer and upper transition metal oxide layer in each HOCL may comprise a certain number of unoxidized metal or alloy atoms to achieve higher conductivity therein. Furthermore, one or more HOCL may comprise a dopant that is one or more of Fe, o, Ni, Ru, Cr, Au, Ag, and Cu to promote higher conductivity.

Figure 5:
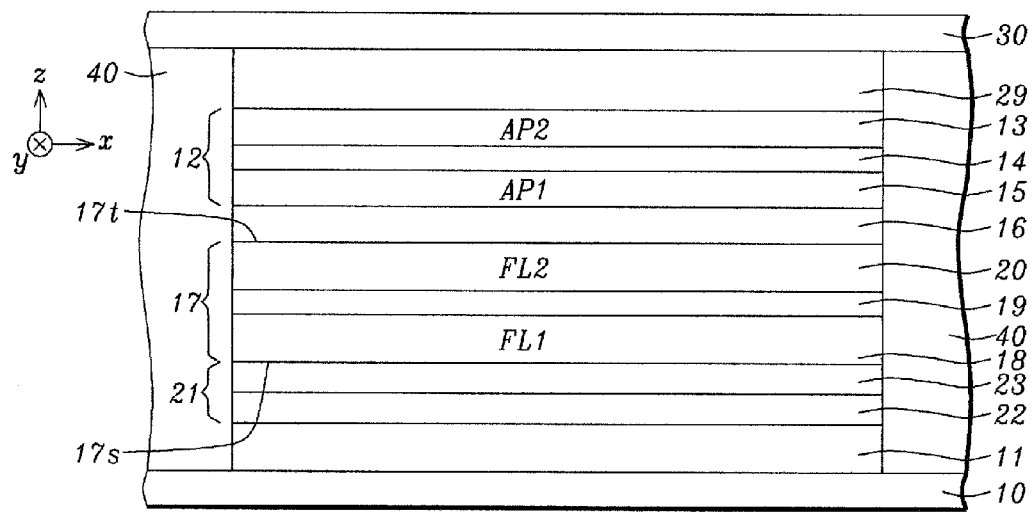
FIG. 5 is a cross-sectional view of a top spin valve structure wherein a HOCL is used to enhance magnetic properties in an overlying free layer.

According to a fifth embodiment shown in FIG. 5, MTJ 1 may have a top spin valve structure in which a HOCL, free layer, tunnel barrier layer, reference layer, and capping layer are sequentially formed on a buffer (seed) layer. Therefore, the top spin valve structure retains the same layers from the second embodiment except the positions of reference layer 12 and free layer 17 are switched, and HOCL 21 is inserted between seed layer 11 and the free layer. Furthermore, transition metal oxide layer 23 becomes the bottom layer in the HOCL stack and the interface oxide layer 22 is the upper oxide layer in order for the latter to maintain an interface with the free layer. In this case, a top surface of the interface oxide adjoins a bottom surface of FL1 layer 18 along interface 17s while FL2 layer forms a second interface 17t with tunnel barrier 16. In an alternative embodiment, the reference layer may have a RL structure and/or the free layer may have a FL structure as defined in the first embodiment. Moreover, the HOCL may be comprised of two transition metal oxide layers wherein a second transition metal oxide layer 24 is inserted between transition metal oxide layer 23 and seed layer 11. Capping layer 29 may comprise one or more of Ru, Ta, or other capping layer materials used in the art.

To illustrate the benefits of a MTJ with a HOCL formed according to an embodiment of the present disclosure, a series of MTJ stacks labeled A-C were prepared with different oxide capping layers. All MTJ stacks have the same sequence of layers formed below the oxide capping layer and are unpatterned. In particular, each MTJ has a NiCr/CoFeB/MgO/CoFeB/oxide capping layer configuration where NiCr is the seed layer, the reference layer and free layer each have a $Co_{20}Fe_{60}B_{20}$ composition and a 12 Angstrom thickness, and the tunnel barrier layer is MgO. In a first sample corresponding to MTJ stack A, a 6 Angstrom thick MgO/TaOx capping layer previously employed by the inventors is used. For MTJ stack B, the oxide capping layer is a MgO/TaOx/RuOx HOCL of the present disclosure wherein the MgO/TaOx layer is prepared by depositing a 3 Angstrom thick film of Mg on the CoFeB free layer followed by depositing a 3 Angstrom thick Ta film on the Mg layer and then oxidizing with a NOX process comprising a 2 standard cubic centimeters per minute (sccm) to 2 standard liters per minute (slm) oxygen flow for a period of 5 to 600 seconds. A MgTaOx interface oxide layer may be used in place of a MgO/TaOx composite interface oxide layer if a MgTa alloy is deposited and then oxidized by the aforementioned NOX process. Thereafter, a 10 Angstrom thick Ru film was deposited on the TaOx layer in the composite interface oxide layer followed by a second NOX process. The resulting RuOx layer in the HOCL is under oxidized to promote higher conductivity. A third sample corresponding to MTJ stack C has a MgO/TaOx/VOx capping layer. The upper oxide layer was formed by depositing a 10 Angstrom thick V layer on the TaOx layer and then performing an oxidation similar to the second NOX process above to give an under oxidized VOx layer. All MTJ stacks were deposited at room temperature and annealed at 400° C. for 30 minutes.

Figure 6:
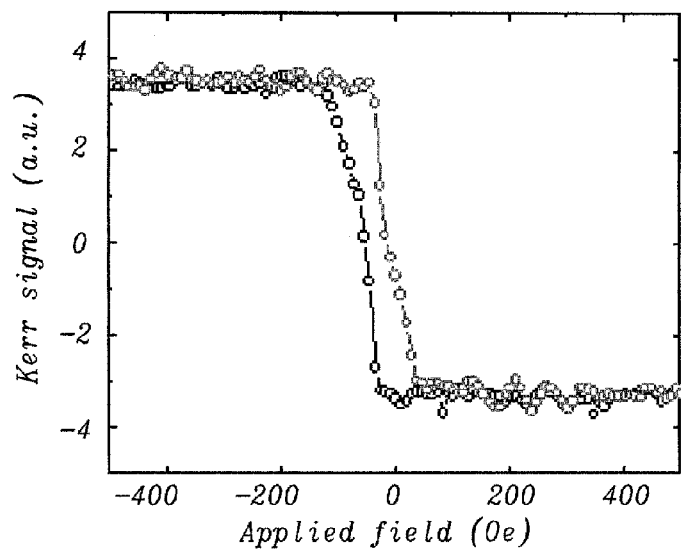
FIG. 6 is a plot of Kerr signal vs. applied field showing PMA in a MTJ with a CoFeB free layer and a MgTaOx capping layer.
Figure 7:
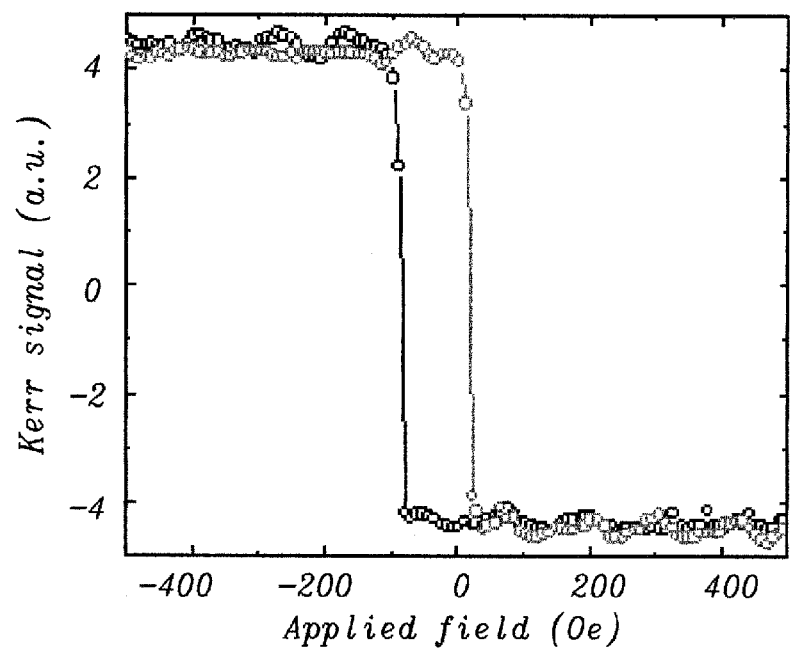
FIG. 7 is a plot of Kerr signal vs. applied field that illustrates enhanced PMA in a MTJ with a CoFeB free layer and a MgTaOx/RuOx HOCL formed according to a method of the present disclosure.
Figure 8:
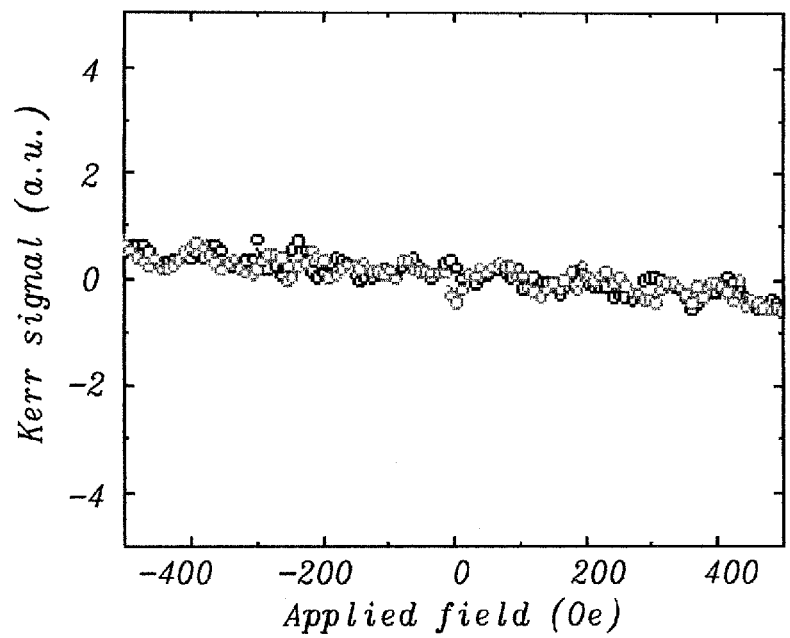
FIG. 8 is a plot of Kerr signal vs. applied field for a MTJ stack in which a HOCL is formed with an upper oxide layer having a higher entropy of oxide formation than a MgO layer.

Referring to FIGS. 6-8, magnetic properties of the MTJ stacks A-C, respectively, were measured perpendicular to the film plane. Sample A in FIG. 6 exhibits substantial PMA character. However, stack B (FIG. 7) shows improved PMA compared with stack A as evidenced by a greater horizontal distance between the two vertical portions of the curves than in FIG. 6. Furthermore, there is a slight enhancement in the saturation signal (maximum Kerr signal value) for stack B which indicates the free layer was damaged less during the oxidation process of the HOCL than during formation of the MgO/TaOx capping layer in stack A. Stack C (FIG. 8) demonstrates that the selection of a metal for the upper oxide layer must have a lower absolute value of free energy of oxide formation than that of the MgO and TaOx interface oxide layers. In the stack C example, the opposite is true. The free energy of oxide formation for $V_2O_4$ is −1329 kjoules/mole (−318 kcal/mole) listed in Table 1 of "Some Thermodynamic Relations Among the Vanadium Oxides, and their Relation to the Oxidation State of the Uranium ores of the Colorado Plateaus", R. Garrels, p. 1251-1265, U.S. Geological Survey, Washington, D.C. Therefore, the absolute value of 1329 kj/mole is greater than that of TaOx (788 kj/mole) and for MgO (1100 kj/mole) in the MgO/TaOx composite interface oxide. As a result, V is believed to getter oxygen from the underlying MgO and TaOx layers thereby lowering the interface oxide oxidation state which in turn reduces PMA formed by the interface with the CoFeB free layer. Moreover, PMA is suppressed and is essentially zero for stack C. On the other hand, VOx may be employed as an interface oxide in a HOCL according to an embodiment of the present disclosure since vanadium's oxygen gettering property maintains a substantial oxidation state in a HOCL such as VOx/TM1Ox or VOx/TM1Ox/TM2Ox where TM1 and TM2 are transition metals or transition metal alloys as described previously.

In embodiments wherein a composite interface oxide layer such as MgO/TaOx is employed in a HOCL, preferably the lower oxide layer contacting the free layer (or ferromagnetic layer) has a higher absolute value of free energy of oxide formation than the upper oxide layer in the interface oxide stack to prevent oxygen from diffusing out of the lower oxide into the upper oxide layer. Therefore, MgO/TaOx is highly preferred over a TaOx/MgO interface oxide configuration.

In some cases, WOx, MoOx, and SnOx are advantageously used as the one or more transition metal oxide layers to impart higher thermal stability to a HOCL.

All of the embodiments described herein may be incorporated in a manufacturing scheme with standard tools and processes. In summary, a substantial gain in thermal stability and PMA is realized without sacrificing other magnetic properties such as MR ratio which is an important advantage in enabling 64 Mb and 256 Mb STT-MRAM technology, and other magnetic devices where low RA value, high MR ratio, and high thermal stability are critical parameters. A key feature is the use of an interface oxide/transition metal oxide capping layer configuration where the transition metal has an absolute value of free energy of oxide formation less than that of the first metal or alloy chosen for the interface oxide. As a result, the first metal or interface oxide with an under oxidized state getters oxygen from the transition metal oxide during an anneal process to allow a less strenuous oxidation process of the first metal. The oxidation sequence of forming a hybrid oxide capping layer as described herein minimizes oxidative damage in the adjoining free layer and leads to an increase in PMA and thermal stability.

While present disclosure has been particularly shown and described with reference to, the preferred embodiment thereof, it will be understood by those skilled in the art that various changes in form and details may be made without departing from the spirit and scope of this disclosure.

We claim:

1. A hybrid oxide capping layer (HOCL) that induces or enhances perpendicular magnetic anisotropy (PMA) in an adjoining ferromagnetic layer in a magnetic device, comprising:
   (a) an interface oxide layer made by oxidation of a first metal or alloy layer which forms an interface with the adjoining ferromagnetic layer; and
   (b) one or more transition metal oxide layers selected from one or more of RuOx, PtOx, RhOx, MoOx, WOx, SnOx, and InSnOx and formed by oxidation of one or more transition metal layers wherein each transition metal has an absolute value of free energy of oxide formation less than that of the first metal or alloy.

2. The hybrid oxide capping layer of claim 1 wherein the interface oxide layer is comprised of one or more of MgTaOx, SrTiOx, BaTiOx, CaTiOx, LaAlOx, MgO, TaOx, MnOx, VOx and BOx.

3. The hybrid oxide capping layer of claim 1 wherein the ferromagnetic layer is a free layer comprised of one or more of CoFeB, CoFe, Co Fe, CoB, FeB, and CoFeNiB.

4. The hybrid oxide capping layer of claim 3 wherein the free layer has a FL1/S/FL2 configuration wherein each of the FL1 and FL2 layers is made of one or more of CoFeB, CoFe, Co, Fe, CoB, FeB, or CoFeBNi, and S is a non-magnetic spacer that is one of Ta, Mg, Zr, Hf, Mo, W, and Nb.

5. The hybrid oxide capping layer of claim 1 wherein the one or more transition metal oxide layers are further comprised of a dopant that is one or more of Fe, Co, Ni, Ru, Cr, Au, Ag, and Cu.

6. A magnetic tunnel junction (MTJ), comprising:
   (a) a reference layer;
   (b) a tunnel barrier layer formed between the reference layer and a free layer;
   (c) the free layer that forms a first interface with a surface of the tunnel barrier layer, and that forms a second interface with an adjoining interface oxide layer in a hybrid oxide capping layer structure; and
   (d) the hybrid oxide capping layer structure comprised of:
      (1) the interface oxide layer that forms the second interface with the free layer, the interface oxide layer is made of a first metal or first alloy;
      (2) a first transition metal oxide layer formed from a second metal or second alloy that has an absolute value of free energy of oxide formation less than that of the first metal or first alloy; and
      (3) a second transition metal oxide layer formed from a third metal or third alloy that has an absolute value of free energy of oxide formation less than that of the first metal or first alloy.

7. The MTJ of claim 6 wherein the MTJ has a bottom spin valve configuration wherein a seed layer, the reference layer, the tunnel barrier layer, the free layer, and the hybrid oxide capping layer are sequentially formed on a substrate, and each of the free layer and reference layer exhibit perpendicular magnetic anisotropy.

8. The MTJ of claim 6 further comprising a second hybrid oxide capping layer that is formed between the seed layer and the reference layer, the second hybrid oxide capping layer has an interface oxide layer adjoining the reference layer and a transition metal oxide layer adjoining the seed layer.

9. The MTJ of claim 6 wherein the interface oxide capping layer is comprised of one or more of MgTaOx, SrTiOx, BaTiOx, CaTiOx, LaAlOx, MgO, TaOx, MnOx, VOx, and BOx.

10. The MTJ of claim 6 wherein each of the first transition metal oxide layer and second transition metal oxide layer is comprised of RuOx, PtOx, RhOx, MoOx, WOx, SnOx, or InSnOx.

11. The MTJ of claim 6 wherein the free layer is comprised of one or more of CoFeB, CoFe, Co, Fe, CoB, FeB, and CoFeNiB.

12. The MTJ of claim 11 wherein the free layer has a FL1/S/FL2 configuration wherein each of the FL1 and FL2 layers is made of one or more of CoFeB, CoFe, Co, Fe, CoB, FeB, or CoFeNiB, and S is a non-magnetic spacer that is one of Ta, Mg, Zr, Hf, Mo, W, and Nb.

13. The MTJ of claim 6 wherein the MTJ has a top spin valve configuration with a seed layer, the second transition metal oxide layer, the first transition metal oxide layer, the interface oxide layer, the free layer, the tunnel barrier layer, and the reference layer sequentially formed on a substrate, the free layer and reference layer each exhibit perpendicular magnetic anisotropy.

14. The MTJ of claim 6 wherein the hybrid oxide capping layer has a resistance×area (RA) value that is reduced by decreasing a thickness of the hybrid oxide capping layer or reducing an oxidation state in one or more of the interface oxide layer, first transition metal oxide layer, and second transition metal oxide layer.

15. The MTJ of claim 6 wherein one or more of the interface oxide layer, first transition metal oxide layer, and second transition metal oxide layer comprise less than a stoichiometric amount of oxygen such that there is unoxidized metal or unoxidized alloy remaining in the hybrid oxide capping layer.

16. The MTJ of claim 6 wherein one or both of the first transition metal oxide layer and the second transition metal oxide layer in the hybrid oxide capping layer are doped with one or more of Fe, Co, Ni, Ru, Cr, Au, Ag, and Cu to increase conductivity therein.

17. The MTJ of claim 9 wherein the interface oxide layer is MgO/TaOx and is formed by oxidation of a Mg/Ta stack wherein Ta has an α-Ta phase, or is MgTaOx and is formed by oxidation of a Mg:Ta alloy wherein Ta has an α-phase.

18. The MTJ of claim 6 wherein the interface oxide layer is a composite with a lower oxide layer that contacts the free layer and an upper oxide layer, the lower oxide layer has a greater absolute value of free energy of oxide formation than the upper oxide layer.

19. A magnetic tunnel junction (MTJ), comprising:
   (a) a reference layer;
   (b) a tunnel barrier layer; and
   (c) a laminated structure represented by (free layer/HOCL)$_m$ where m is ≥2 and HOCL is a hybrid oxide capping layer comprised of a lower interface oxide layer and at least an upper transition metal oxide layer having an absolute value of free energy of oxide formation less than that of the interface oxide layer.

20. The MTJ of claim 19 wherein the free layer is comprised of one or more of CoFeB, CoFe, Co, Fe, CoB, FeB, and CoFeNiB.

21. The MTJ of claim 19 wherein each of the lower interface oxide layers is comprised of one or more of MgTaOx, SrTiOx, BaTiOx, CaTiOx, LaAlOx, MgO, TaOx, MnOx, VOx, and BOx.

22. The MTJ of claim 19 wherein each of the upper transition metal oxide layers is comprised of one or more of RuOx, PtOx, RhOx, MoOx, WOx, SnOx, or InSnOx.

23. The MTJ of claim 19 wherein one or both of the lower interface oxide layer and upper transition metal oxide layer in each HOCL comprises less than a stoichiometric amount of oxygen such that there is unoxidized metal or unoxidized alloy remaining in each of the HOCL layers.

24. The MTJ of claim 19 wherein one or more of the HOCL layers in the laminated (free layer/HOCL)$_m$ structure is comprised of a dopant that is one or more of Fe, Co, Ni, Ru, Cr, Au, Ag, and Cu.

* * * * *